United States Patent [19]

Kabadi et al.

[11] Patent Number: 5,057,023
[45] Date of Patent: Oct. 15, 1991

[54] HIGH DENSITY CONNECTOR SYSTEM

[75] Inventors: Ashok N. Kabadi, Beaverton; Leonard O. Turner, Hillsboro; Ronald C. Flamm, Newberg, all of Oreg.

[73] Assignee: Intel Corporation, Santa Clara, Calif.

[21] Appl. No.: 532,015

[22] Filed: Jun. 1, 1990

[51] Int. Cl.⁵ .............................................. H01R 9/09
[52] U.S. Cl. ..................................... 439/67; 439/457; 439/493
[58] Field of Search ....................... 439/67, 68, 73, 77, 439/457, 493, 495, 499

[56] References Cited

U.S. PATENT DOCUMENTS 4,917,613 4/1990 Kabadi .................................. 439/67

Primary Examiner—Paula A. Bradley
Attorney, Agent, or Firm—Blakely, Sokoloff, Taylor and Zafman

[57] ABSTRACT

A connection system for use in connecting a high density flexible circuit directly to a surface mounted integrated circuit component mounted on a printed circuit board. The connection system utilizes an upper and lower stiffener plate to route the contacts of the high density flexible circuit to the pins of the integrated circuit component. The connection system utilizes silicone rubber pressure rods to create a force on the contacts of the higher density flexible circuit to ensure reliable connection to the leads of the surface mounted components. The connection system utilizes comb spacers which define slots to align the contacts of the high density circuit to the pins of the integrated circuit component and a top clamp to retain the assembly onto the integrated circuit component.

16 Claims, 4 Drawing Sheets

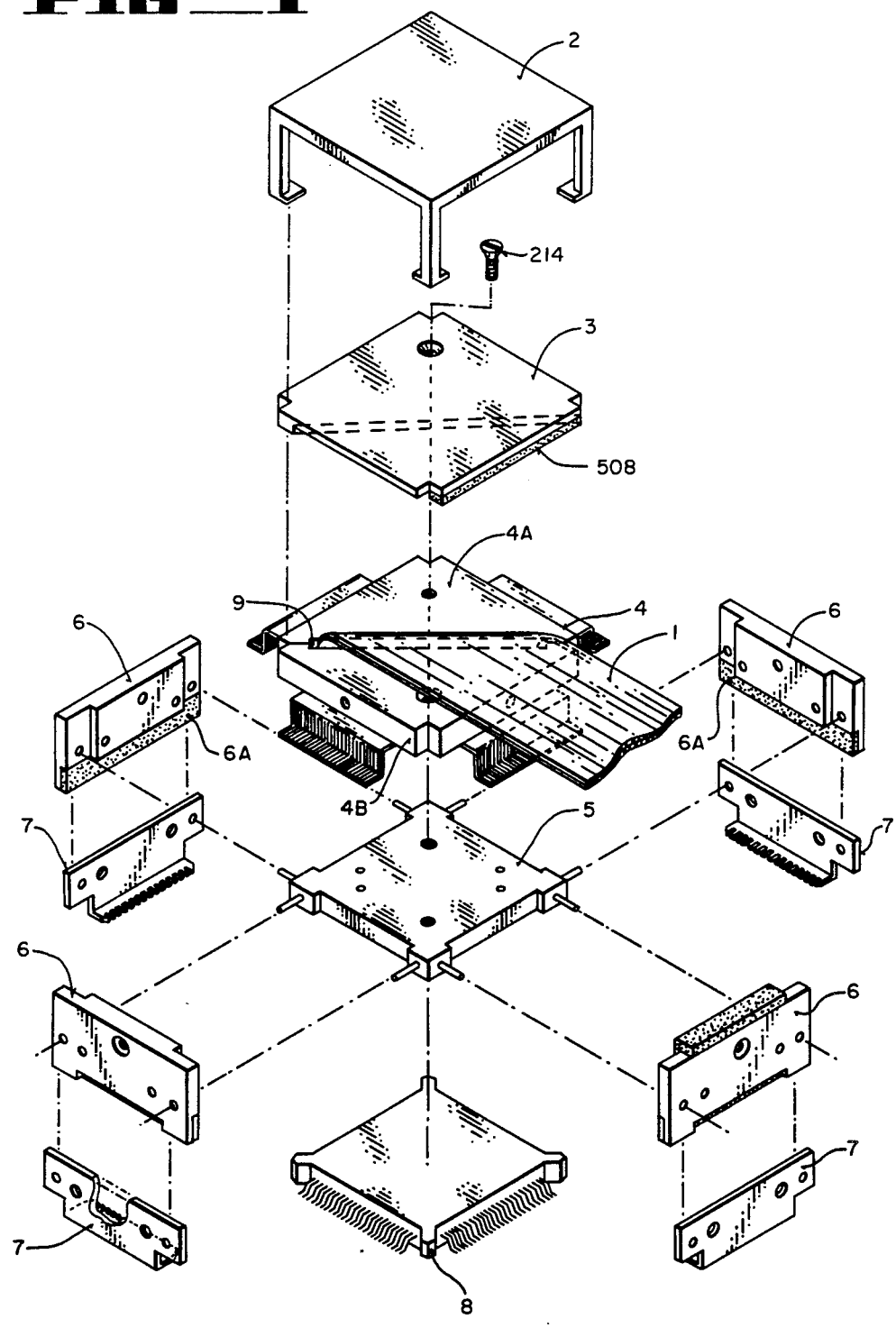

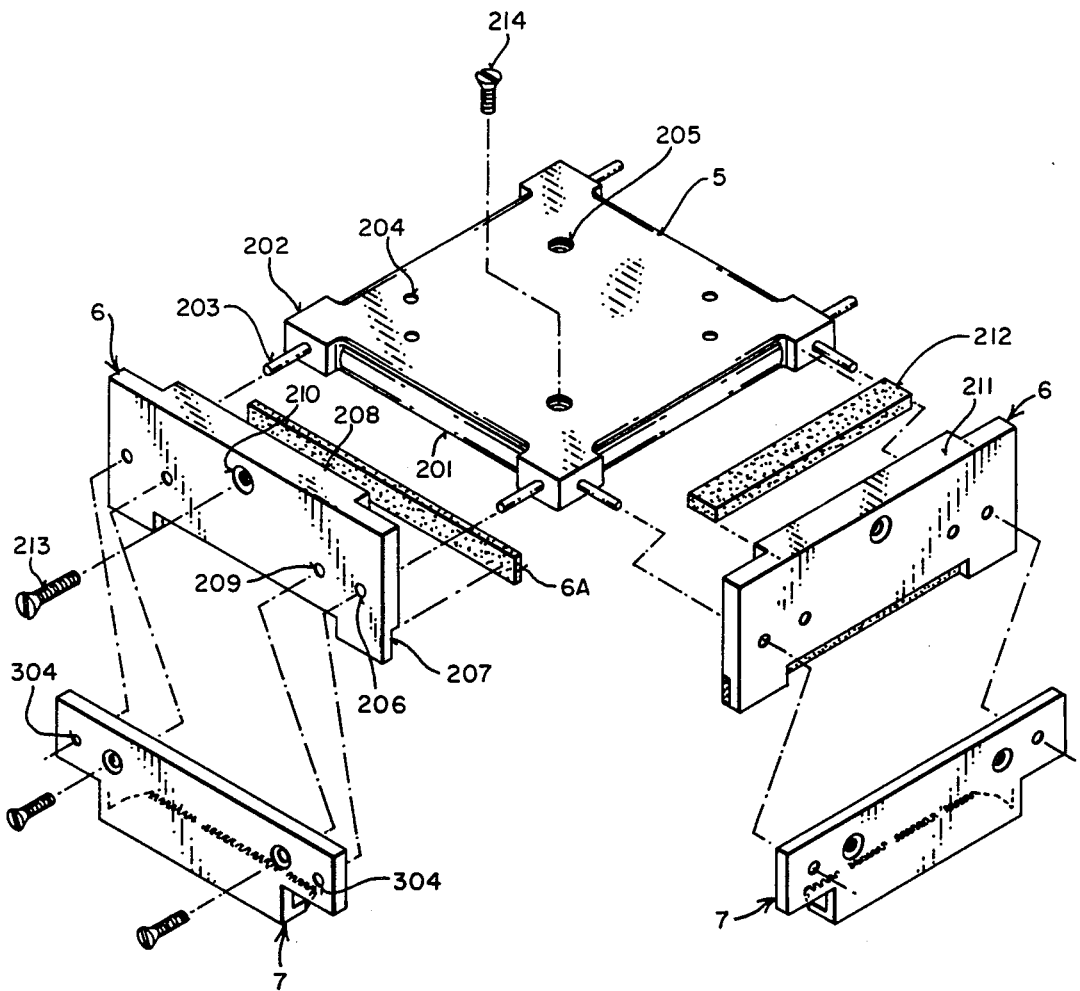
FIG_2
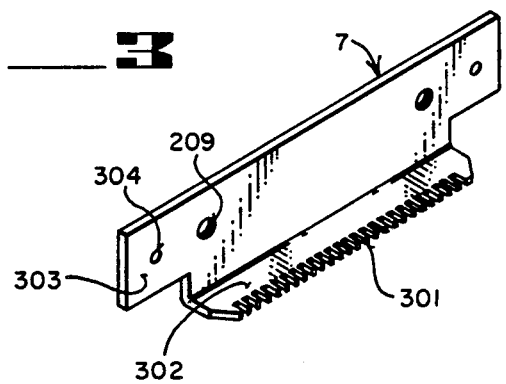
FIG_3

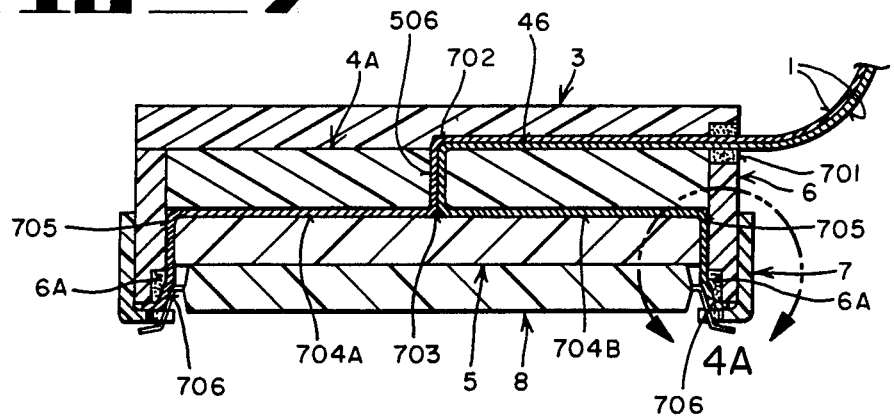
FIG_7
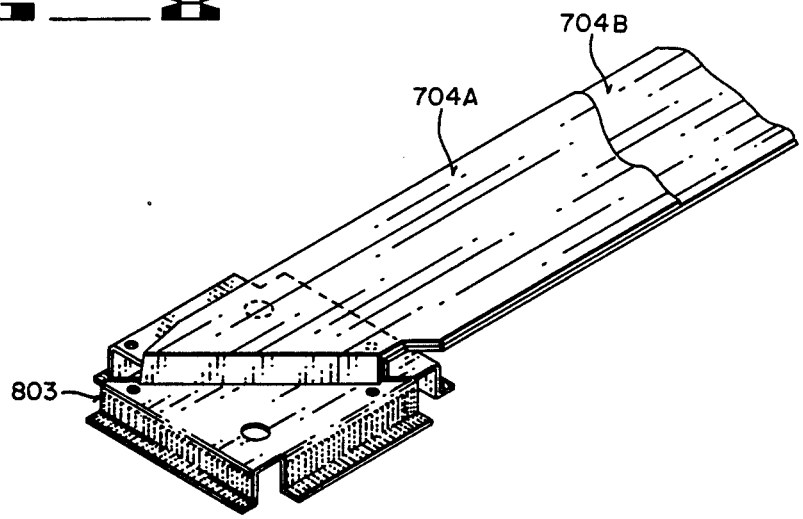
FIG_8
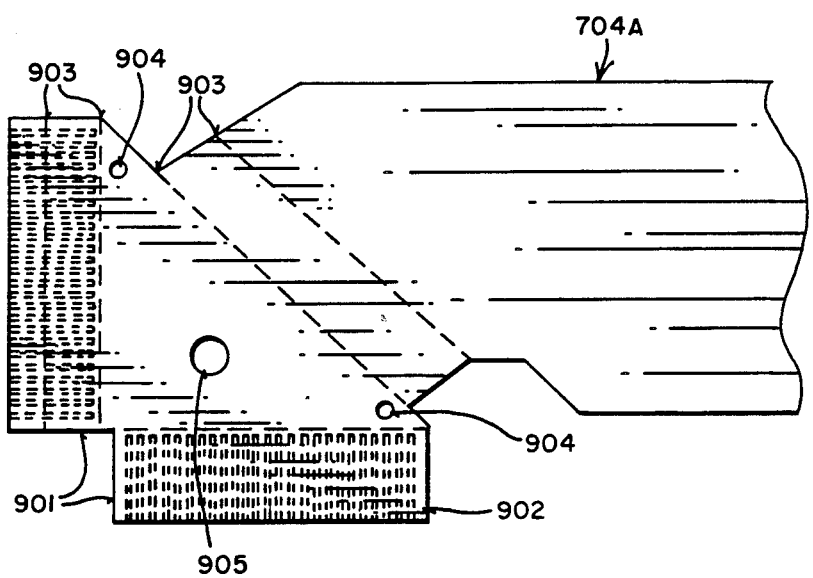
FIG_9

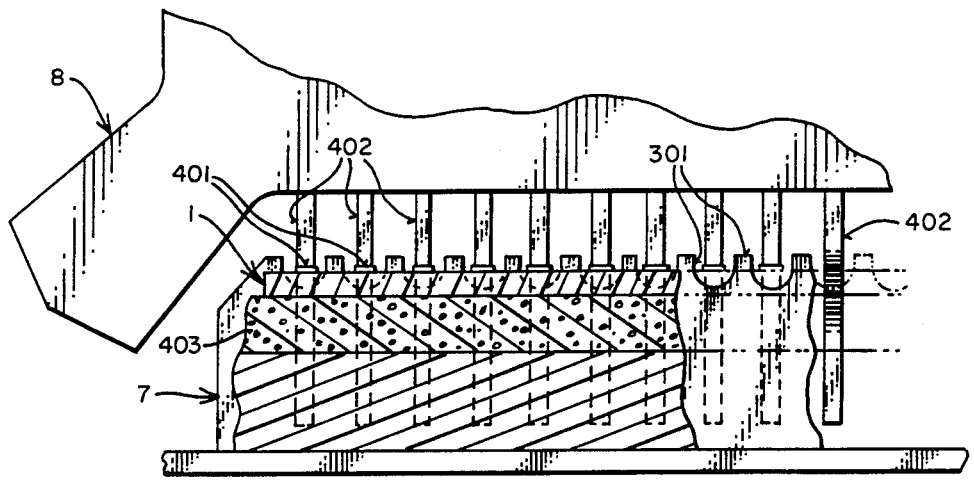
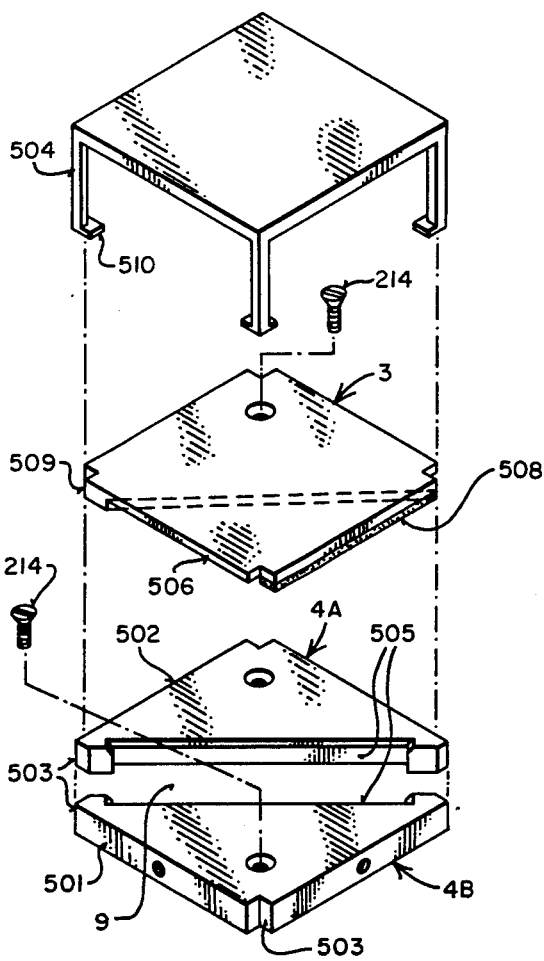
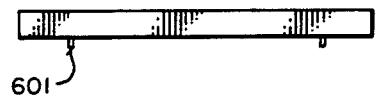
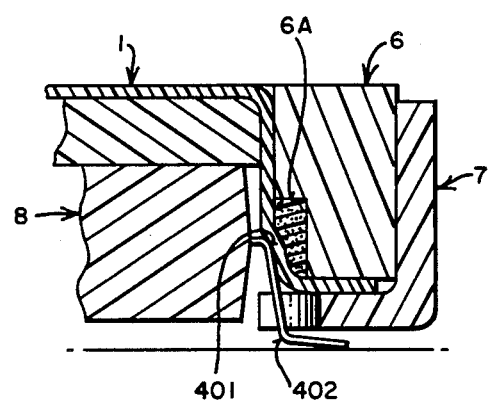

HIGH DENSITY CONNECTOR SYSTEM

BACKGROUND OF THE INVENTION

1. Field of the Invention

This invention relates to the field of electrical connectors, and particularly to electrical connectors for connecting high density flexible circuits to surface mounted integrated circuit components.

2. Prior Art

Pin and socket connectors are a well known prior method of creating an electrical connection between a flexible circuit and integrated circuit components attached to printed circuit boards (PCBs). The sockets are permanently attached to the printed circuit board and are electrically connected to the components on the PCB. A pin assembly that matches the socket is attached to one end of the flexible circuit. The electrical connection is established by insertion of the pins into the socket. A drawback of this assembly is that the connector is bulky, can be difficult to assemble and adds trace length, thereby slowing the signal.

A second prior method is exemplified by U.S. Pat. No. 4,850,883, Kabadi titled High Density Flexible Connector. This reference also requires the use of an assembly permanently attached to the PCB, here a clamping system. The clamping system is electrically connected to the PCB and consists of metal-on-elastomer (MOE) strips held in place by an MOE holder. In this method the high density flexible circuit terminates into contact pads. The electrical connection is created by clamping the the MOE strips between contacts on the PCB and the contacts of the high density flexible circuit.

It is an object of the present invention to develop an improved connection system for connecting electrical circuits, such as high density flexible circuits or cables, directly to surface mounted integrated circuit components avoiding the requirement of providing separate leads on a PCB from the integrated circuit to a connection assembly.

SUMMARY OF THE INVENTION

An improved electrical connector is described for use in connecting high density flexible circuits directly to surface mounted integrated circuit components mounted on a Printed Circuit Board (PCB). The invention consists of a high density flexible circuit which is connected to a surface mounted component through a clamping system. The clamping system consists of two stiffener plates through which the high density flexible circuit is routed, a comb spacer which aligns the connectors of the flexible circuit with the pins of the surface mounted component, a strain relief clamp which distributes the strain along the flexible circuit and a top clamp which snaps the system onto the surface mounted component. The invention also discloses the electrical contacts and dual cable structure of the high density flexible circuit.

The invention discloses several important features including means to alleviate high stress areas of the flexible circuit, means for constructing the contacts of the flexible circuit to connect to the pins of the surface mounted component, means to provide a normal force on the contacts to insure good contact, means to route the the flexible circuit through the connector assembly and means to align the flexible circuit with the pins of the component.

The present invention utilizes a high density flexible circuit such as those described in U.S. Pat. No. 4,798,918, Kabadi, et al. entitled High Density Flexible Circuit and in U.S. Pat. No. 4,917,613, Kabadi, entitled High Density Connection System which patents are incorporated herein by reference.

This invention has been motivated by the increasing miniaturization of integrated circuits and the advent of surface mount technology. These progressions in integrated circuit technology have made existing test access techniques inadequate.

BRIEF DESCRIPTION OF THE DRAWINGS

FIG. 1 is a perspective view of component parts of a connector system as may be utilized by the present invention.

FIG. 2 is a perspective view of a lower assembly of the connector system.

FIG. 3 is a perspective view of a comb spacer as may be utilized by the present invention.

FIG. 4 is a top view of the comb spacer illustrating alignment of the pins of the surface mounted component with the contacts of the flexible circuit.

FIG. 4A is a cross sectional view of the assembly mounted to a surface mounted component.

FIG. 5 is a perspective of components of a top assembly of the connector system.

FIG. 6 is a side view of a upper stiffener clamp of the connector system.

FIG. 7 is a cut away view of a flexible circuit routed through the connector system and shows the flexible circuit attached to a component.

FIG. 8 is a top view of the high density circuit when folded.

FIG. 9 is a top view of the high density circuit cable in an unfolded position.

DETAILED DESCRIPTION OF THE PRESENT INVENTION

A connecting system for connecting a high density flexible circuit to a surface mounted integrated circuit component permanently attached to a printed circuit board (PCB) is disclosed. In the following description, numerous specific details are set forth to provide a thorough understanding of the present invention. It will be obvious to one skilled in the art that the invention may be employed without these specific details. In other instances, well-known methods and structures have not been set forth in order not to unnecessarily obscure the present invention.

In the preferred embodiment, the invention described is used to connect a high density flexible circuit to a surface mounted 100 pin Plastic Quad Flat Pack (PQFP) component which has leads on 0.025" centers. PQFP components typically have 25 contact pins per side but this invention could also be used for higher or lower pin count PQFP components or for components which have leads on other centers such as 0.65 mm or 0.80 mm centers. The preferred embodiment of the invention is illustrated in FIG. 1.

Referring to FIG. 1, the primary components in the preferred embodiment are top clamp 2, strain relief clamp 3, upper stiffener plates 4A and 4B, lower stiffener plate 5, four (4) side blocks 6, four (4) comb spacers 7, and high density flexible circuit 1. Surface mounted component 8 is also illustrated in FIG. 1. In FIG. 1, a high density flexible circuit 1 enters through the diagonal slot 9 formed by the upper stiffener plates 4A and 4B. The flexible circuit 1 is routed around the lower stiffener plate 5 to the pins of the surface mounted component 8. The comb spacer(s) 7 align the individual contacts from the flexible circuit 1 to their corresponding pins on the surface mounted component 8.

The strain relief clamp 3 is aligned with the upper stiffener plate 4 and lower stiffener plate 5 and acts to dampen any direct force of the top clamp 2 onto the flexible circuit 1. The top clamp 2 is used to snap the connector assembly onto the corners of the surface mounted component 8 and to overcome the vertical component of the force applied by pressure pads 6A.

The lower assembly of the preferred embodiment is illustrated in more detail by FIG. 2. The lower stiffener plate 5 is shaped to provide optimal routing of the flexible circuit 1. The lower stiffener plate 5 is square shaped with each side defining a long narrow cutout 201 that is 0.615 inches wide. The depth of the cutout 201 is 0.062 inches. The flexible circuit 1 is routed to the pins of the surface mounted component 8 through the cutout 201. The cutout 201 creates square protrusions 202 at each corner of the lower stiffener plate 5. Locating pins 203 are positioned on the outer face of each of these protrusions 202 through which the side blocks 6 and comb spacer 7 are aligned. The top surface of the lower stiffener plate 5 defines four clearance holes 204 for the alignment pins of the upper stiffener plates 4A and 4B and two threaded holes 205 for fastening to the upper stiffener plate with two (2) no. 2-56 screws.

In the preferred embodiment, the lower stiffener plate 5 is constructed from anodized aluminum. The lower stiffener plate 5 has radiused edges. Its dimensions are 1.05×1.05×0.150 inches.

Still referring to FIG. 2, in the preferred embodiment, four comb spacers and four side blocks are utilized. Each side block 6 defines two round slots 206 for alignment with the locating pins 203. Each side block 6 further defines two short legs 207. The length of the legs 207 is 0.025 inches. The distance between the legs is 0.615 inches. This creates a clearance for the flexible circuit 1, when formed under side block 6 (illustrated in FIG. 4A). The inner surface of the side block 6 is raised on its far sides so to create a long flat projection 208 that is 0.615 inches in width. This projection fits into the cutouts 201 on the sides of the lower stiffener plate 5. The lower portion of the inner surface of each side block 6 is recessed to provide a precisely controlled seat for a silicone pressure pad 6A, which is secured in that seat with adhesive. This pressure pad provides the force that assures that the contact pads on the flexible circuit, are electrically connected to the pins of the surface mounted component 8. The outer face of the side block 6 defines two threaded holes 209 for fastening the comb spacer 7. A third hole 210 is defined by the side block 6, and is used for fastening to the upper stiffener plates 4A and 4B. Of the 4 side blocks one is shorter on the upper half 211 by 0.15 inches. A soft rubber foam 212 is placed on the top of the shorter side block 211 in order to provide a flex relief and a dampening of the force on the flexible circuit 1 as it enters the connection assembly.

In the preferred embodiment, the side block 6 is made out of anodized aluminum. Its dimensions are 0.45×0.70×1.25 inches. In the preferred embodiment the soft rubber foam is made of 1/16 inch thick Porom TM strip, P/N 4716-16-20062-1633 manufactured by Rogers Corp. Industrial Materials Group, Poron Division of East Woodstock, Conn.

Referring to FIG. 3, the comb spacer 7 is "L" shaped and defines alignment slots 301 on the bottom horizontal surface 302. These alignment slots 301 serve to physically align the adapter to the pins of the surface mounted component 1. The horizontal surface 302 of the comb spacer 7 fits flush underneath the side block 6. The comb spacer 7 is fastened to the outer surface of the side block 6 using two (2) no: 2-56 screws through holes 204 defined on the vertical surface 303. Two holes 304 defined by the vertical surface 303 are used for alignment with the pins 203 defined by the lower stiffener plate 5. In the preferred embodiment the comb spacer has the dimensions 0.20×0.75×0.062 inches and is made of 10% glass-filled polycarbonate.

To attach the lower assembly described in FIG. 2, to the assembly components to be described in FIG. 5, the side blocks 6 are fastened to the upper stiffener plates 4A and 4B horizontally by screws 213. To fasten vertically, screw 214 (shown in FIG. 1) travels through the strain relief clamp 3, high density circuit 1, upper stiffener plate 4 to receiving holes 205 defined in the lower stiffener plate 5. Screw 215 travels the same path except that it does not go through the strain relief clamp 3, but does go through a hole 905 defined by flexible circuit 1 (illustrated in FIG. 9).

FIG. 4 illustrates the comb spacers 7 alignment of the leads 402 of the surface mounted component 8 with the contacts of the flexible circuit 1. When the connection system is assembled, the contact pads 401 of the high density flexible circuit 1 are positioned so that they align with the slots 301 defined by the comb spacer 7. As the system is lowered down on to the surface mounted component 8, the comb spacers 7 make the final fine alignment with the leads of the surface mounted component 8. Referring to FIG. 4A a soft rubber foam pressure pad 6A fastened to the side block 6 exerts pressure on the back side of flexible circuit 1 in the area of the contacts 401. As the assembly is snapped onto the corners of the surface mounted component, a force is placed on the contacts of the flexible circuit 401 onto the leads 402 of the surface mounted component 8. This force insures a reliable electrical contact.

FIG. 5 illustrates the upper stiffener plates 4A and 4B, strain relief clamp 3 and the top clamp 2. The upper stiffener plate is comprised of two symmetrical triangular shaped plates 4A, 4B. The two piece design of the upper stiffener plate aids in the assembly of the component parts of the present invention, particularly with respect to routing flexible circuit 1. Plates 4A and 4B define grooves 503 for the legs 504 of the top clamp 2 to extend down onto the surface mounted component 8. The dimensions of the grooves are 0.102×0.080×0.200 inches. The plates 4B and 4A define a cutout along the hypotenuse edge 505, so that when the two are placed together, they form a square and a slot 506 is formed through which the flexible circuit 1 passes through. The slot 506 defined by the upper stiffener plates 4A and 4B has radiused edges on both top and bottom. The length of the slot 506 is 1.025 inches. FIG. 6 illustrates the bottom of the upper stiffener plate 4. Each of the two plates 501 and 502 define two alignment pins 601 by which the flexible circuit 1 is aligned.

In the preferred embodiment, when assembled, the upper stiffener plates 4A and 4B have the dimensions 1.038×1.038×0.200 inches. In the preferred embodiment, the upper stiffener plate 4 is made of anodized aluminum. The finish is polyurethane, 0.003" to 0.005" thick.

Referring back to FIG. 5, the strain relief clamp 3 is square in shape and is used to minimize stress on the flexible circuit 1. The dimensions of the strain relief clamp 3 are 1.036×1.036×0.093 inches. The strain relief clamp 3 defines a cutout 506 on its inner surface where the flexible circuit 1 enters the connection assembly. The dimensions of cutout 506 are 0.965×0.936×0.062 inches. This prevents any hard clamping on the electrical traces of the high density flexible circuit 1. Soft rubber foam 508 is fastened with glue to the side of the assembly through which the flexible circuit 1 enters. The soft rubber foam 508 acts as a strain relief and distributes the hard force over the length of the flexible circuit 1 rather than concentrating it to a specific point. The strain relief clamp 3 defines cutout 509 along the corners through which the legs 504 of the top clamp 2 run down. The dimensions of cutout 509 are 0.102×0.080×0.093 inches.

In the preferred embodiment, the soft rubber foam 508 used is 0.062 thick Poron. The strain relief clamp 3 is made out of anodized aluminum.

The top clamp 2 is shaped like a square four legged table. The bottoms of each of these legs define a lip 510 which the top clamp 2 uses to grasp the corner of the surface mounted component 8. The top clamp 2 will snap on to the sides of the surfaced mounted component 8 and hold the connector assembly in place. The dimensions of the top clamp 2 are 1.037×1.037 inches. The dimensions of the top clamp legs are 0.095×0.076×0.655 inches.

FIG. 7 shows the routing of flexible circuit 1 through the connector assembly. Flexible circuit 1 enters the assembly through a horizontal slot 701 defined by the strain relief clamp 3 and one of the four side blocks.

The flexible circuit 1 bends 90 degrees 702 into the diagonal slot 506 defined by the upper stiffener plates 4A and 4B. High density flexible circuit 1 bends 90 degrees 703 on the inside surface of the upper stiffener plates 4A and 4B and is positioned by the alignment pins 601 (not illustrated) described earlier, on the upper stiffener plates 4A and 4B.

The cables 704A and 704B which comprise the high density circuit 1 are split into different directions, between the upper stiffener plates 4A and 4B and the lower stiffener plate 5. In the preferred embodiment, fifty contact pads are formed on cable 704A and fifty contact pads are formed on cable 704B. The cables 704A and 704B are constructed such that 25 contact pads will be routed to each of the four sides of the surface mounted component 8. The construction of cables 704A and 704B are described in more detail below.

The cables 704A and 704B are fastened to the underside of the upper stiffener plates 4A and 4B using the lower stiffener plate 5 and (2) no: 0-80 screws. An alternative embodiment may use a different fastening means than the screws illustrated. The cables 704A and 704B bends 90 degrees downwards 705 towards the leads of the surface mounted component 8 and the alignment slots 301 defined by the comb spacer 7. The vertical surface of the pads on the flexible circuit are pressed against the near vertical surfaces of the surface mounted component 8 by the pressure pad 6A. The flexible circuit 1 makes a final 90 degree bend 706 away from the surface mounted component 8 to provide a lead-in chamber for forcing the connector down over surface mounted component 8, compressing pressure pad 6A in the process, without damaging flexible circuit 1.

FIG. 8 illustrates the preferred embodiment of the high density circuit 1 as if it were in the connector assembly. The high density circuit is physically comprised of two cables 704a, 704b. Each of these cables in itself embodies a high density circuit similar to that described in the prior art reference U.S. Pat. No. 4,798,918, Kabadi et al. titled High Density Flexible Circuit. Each cable 704a, 704b bends around the components of the assembly into the shape 803 shown in FIG. 8.

FIG. 9 shows a cable in a flat, unfolded state. This cable is similar to cables described in the prior art reference U.S. Pat. No. 4,917,613, Kabadi, entitled High Density Connection System. Each of the cables has 50 contact pads 901 for electrical connection. It would be obvious to one in the art that the number of electrical connections would be dependant on the number of pins on the component to be connected to. In the preferred embodiment, 25 of the contact pads are placed perpendicular to the direction of the cable 902. When the cable is folded, 25 contact pads will be directed to one side of the surface mounted component 8 and 25 contact pads will be directed to an adjacent side of the surface mounted component 8. This conforms to the fact that 25 pins are located on each side of the PQFP surface mounted component. The dashed lines 903 in FIG. 9 represent the bend points of the cable across the components of the connection system. The alignment holes 904 and fastening hole 905 are also defined by the cable. The alignment holes 904 are aligned with the pins 601 of the upper stiffener plates 4A and 4B (illustrated in FIG. 6). The fastening hole 905 is used to accommodate the fastening of the flexible circuit 1 to the upper stiffener plate 4A.

In the preferred embodiment, each contact pad is made of 1 ounce copper, 0.0014" thick, and is plated with nickel and gold. Nickel plating is in accordance with QQ-N-290A class 2, electrolytically deposited on copper pads. The thickness of nickel is 0.000150" min. Gold plating is in accordance with MIL-G-45204, type II, grade C, Knoop hardness 130 to 220 (inclusive). It will be obvious to one skilled in the art that alternative forms of plating, e.g. plating by using harder material like palladium instead of gold, may be employed. The non conductive side of the contact pad consists of a 0.003 inch Kapton TM strip and a 0.001 inch Teflon top layer.

The cable of the flexible circuit in the preferred embodiment consist of a 0.003 inch Kapton TM strip with a plurality of 0.0014 inch thick copper traces placed on either side and a 0.001 inch Teflon TM coating on either side. The outer layer of the cable has a strain relief consisting of a strip of 0.002 inch thick Kapton TM material over the Teflon TM coating.

The present invention offers a number of advantages when compared with the prior art. The system is versatile since the non-connector assembly end of the high density flexible circuit can be terminated by any type of socket or connector. Additionally, the need for an intermediate connector is eliminated because the contact pads of the flexible circuit make direct contact with the leads of the integrated circuit component.

It will be obvious to one skilled in the art that alternatives from the specifications for the preferred embodiment may be found. In addition, the specification presented for the preferred embodiment is not meant to be limiting, but is presented as an example of one embodiment of the present invention.

Thus, a high density flexible circuit to surface mounted integrated circuit component connection system has been described. Utilizing gold plated contact pads at the end of the high density flexible circuit, a routing scheme through the connection assembly and clamping components, a high density flexible circuit may be attached directly to a surface mounted integrated circuit component.

We claim:

1. A connector assembly for electrically connecting a flexible circuit with conductive pins of a surface mounted integrated circuit component, said flexible circuit defining a plurality of exposed conductive pads, said surface mounted integrated circuit component nonremovably coupled to a printed circuit board, said connector comprising:
   routing means for routing said flexible circuit towards said pins of said surface mounted integrated circuit component;
   a plurality of side blocks, each of said plurality of side blocks coupled to said routing means;
   a plurality of comb spacers coupled to a corresponding one of said blocks, each of said comb spacers defining a plurality of slots, each of said plurality of slots corresponding to an associated one of said pins of said surface mounted integrated circuit component;
   a clamping means, said clamping means defining a plurality of legs said legs for fastening said connector to said surface mounted integrated circuit component;
   a compressible material coupled to said side blocks, said compressible material for dampening a vertical force created by said clamping means, when said clamping means is fastened to said surface mounted integrated circuit component, said flexible circuit coupled to a bottom side of said compressible material.

2. The connector assembly as recited by claim 1 wherein said flexible circuit is comprised of an insulated top side and exposed conductive pads on the bottom side.

3. The connector assembly as recited by claim 1 wherein said comb spacers electrically and physically isolate the pins of said surface mounted component.

4. The connector assembly as recited by claim 3 wherein said exposed conductive pads of said flexible circuit are constructed to physically align with said pins of said surface mounted component.

5. The connector as recited by claim 3 wherein an associated one of said exposed conductive pads corresponds to and is electrically coupled with an associated one of said pins of said surface mounted integrated circuit component.

6. The connector as recited in claim 5 wherein said routing means is comprised of a first stiffener means and a second stiffener plate.

7. The connector as recited in claim 6 wherein said first stiffener means is comprised a first triangular plate and a second triangular plate, said first stiffener means further defining a slot disposed diagonally from one corner to an opposite corner of said first stiffener means.

8. The connector as recited in claim 7 wherein said flexible circuit is coupled to said first stiffener means through said slot and is further coupled to a top surface and sides of said second stiffener plate.

9. The connector as recited in claim 8 wherein said surface mounted integrated circuit is a PQFP packaged surface mounted integrated circuit component.

10. An improved connector system for electrically coupling a high density flexible circuit to a surface mounted integrated circuit mounted on a printed circuit board, said connector system having a first stiffener plate, a first flexible circuit and a second flexible circuit, said first stiffener plate defining a slot disposed diagonally from one corner to an opposite corner of said first stiffener plate, said first flexible circuit and said second flexible circuit coupled with said first stiffener plate through said slot, said improvement comprised of:
    a second stiffener plate, said first flexible circuit and said second flexible circuit coupled to a top surface and sides said second stiffener plate;
    a plurality of side blocks for coupling exposed conductive pads defined by said high density flexible circuit with exposed conductive pins defined by said surface mounted integrated circuit, said plurality of side blocks coupled to a clamping means, each of said plurality of side blocks fastened to said second stiffener plate;
    a plurality of comb spacers, each of said plurality of comb spacers coupled to a corresponding side block, said plurality of comb spacers for aligning said exposed conductive pads with said exposed conductive pins; and
    said clamping means for attaching said connector system to said surface mounted integrated circuit.

11. The improved connector system as recited in claim 10 wherein said plurality of side blocks is further comprised of a compressible material, said high density flexible circuit coupled to a bottom side of said compressible material.

12. The improved connector system as recited in claim 11 wherein said exposed conductive pins of said surface mounted integrated circuit define a first substantially horizontal part and a second substantially vertical part.

13. The improved connector system as recited in claim 12 wherein said conductive pads of said high density flexible circuit are coupled to said second substantially vertical part of said exposed conductive pins of said surface mounted integrated circuit.

14. The improved connector system as recited in claim 13 wherein each of said plurality of comb spacers defines an first horizontal surface and a second vertical surface, said first horizontal surface defining a plurality of slots corresponding to said exposed conductive pins of said surface mounted component, said high density flexible circuit coupled to said first horizontal surface.

15. The improved connector system as recited in claim 14 wherein said clamping means is a table clamp.

16. The improved connector system as recited in claim 15 wherein said surface mounted integrated circuit is a PQFP packaged surface mounted integrated circuit component.

* * * * *